OHMIC CONTACT TO SEMICONDUCTOR DEVICES

Original Filed Oct. 1, 1965

JACK H. CLARK
JAMES F. HAEFLING
GRAYDON B. LARRABEE
JAMES H. VAN TASSEL
INVENTORS

BY John D. Graham
ATTORNEY

JACK H. CLARK
JAMES F. HAEFLING
GRAYDON B. LARRABEE
JAMES H. VAN TASSEL
INVENTORS

BY John D. Graham
ATTORNEY

INVENTORS
JACK H. CLARK
JAMES F. HAEFLING
GRAYDON B. LARRABEE
JAMES H. VAN TASSEL

BY John W. Graham
ATTORNEY

INVENTORS
JACK H. CLARK
JAMES F. HAEFLING
GRAYDON B. LARRABEE
JAMES H. VAN TASSEL

John W. Graham
ATTORNEY

INVENTORS
JACK H. CLARK
JAMES F. HAEFLING
GRAYDON B. LARRABEE
JAMES H. VAN TASSEL
BY John E. Graham
ATTORNEY United States Patent Office 3,419,765
Patented Dec. 31, 1968

3,419,765
OHMIC CONTACT TO SEMICONDUCTOR DEVICES

Jack H. Clark, Garland, James H. Van Tassel, Dallas, and Graydon B. Larrabee and James F. Haefling, Richardson, Tex., assignors to Texas Instruments Incorporated, Dallas, Tex., a corporation of Delaware Continuation of application Ser. No. 492,207, Oct. 1, 1965. This application June 1, 1967, Ser. No. 642,975
15 Claims. (Cl. 317—234)

ABSTRACT OF THE DISCLOSURE

Disclosed is a multilayer system for making contacts and interconnections between regions on a semiconductor device. A multilayer contact is used which will adhere well to silicon oxide layers which may be on either side of the contact system.

This is a continuation of application Ser. No. 492,207, filed Oct. 1, 1965, and now abandoned.

This invention relates to semiconductor devices, and more particularly to ohmic contacts for transistors, integrated circuits or the like, and to the methods for making such contacts.

Within the semiconductor field, and particularly in the area of integrated circuits, there is a continuing trend toward fabricating devices of smaller and smaller dimensions. Accordingly, the ohmic contacts to the various regions of these devices must be extremely small, such contacts ordinarily being very thin film conductive strips about one or two-tenths of a mil or less in width.

Due to the extremely small size of these thin film conductive strips, it is virtually impossible to bond external lead wires thereto, and so an expanded contact arrangement is utilized whereby the thin film strips making direct contact to the semiconductor material extend out over an oxide layer overlying the semiconductor surface and terminate in enlarged bonding pads to which the external leads may be attached.

Both the thin film conductive strips making contact directly to the semiconductor material and the external lead wires to the particular device must be composed of materials which have good chemical, electrical, thermal and mechanical properties. While problems in making electrical contacts exist for all semiconductors, the selection of material for the thin film strips and the external wires is especially difficult when the semiconductor material is silicon, and the present invention is primarily directed to a contact arrangement which is useful for silicon devices.

The primary requirements of thin film conductive strips for a silicon device are that they be formed of metal or metals which exhibit good adherence to the silicon and to the silicon oxide. In addition, the metal should provide an ohmic and low resistance contact to the silicon semiconductor surface. Moreover, if the metal used is a donor or acceptor of the semiconductor material, it must have a low solubility so that the tendency to form a junction can be thwarted by heavy doping of the contact area.

Furthermore, the expanded contact metal should not form an alloy with the semiconductor material at temperatures used in bonding leads to, or packaging, the device. Formation of such an alloy would result in the undesirable penetration into the shallow semiconductor regions. Additionally, the contact material should not have a melting point beyond that to which the device would be exposed in subsequent processing and operation. Also to fulfill the objective of employing the most convenient manufacturing methods in fabricating semiconductor devices, the contact material selected should permit the use of evaporation as a technique for the deposition and use of photomasking and etching to remove the deposited material in the unwanted areas, since these techniques are most effective where very thin films are required.

Considering now the material used for the external lead wires to the semiconductor devices, the primary requirements are that they be of high conductivity, possess a high melting point, are chemically stable in air, and may be easily worked so as to facilitate handling and bonding even with the extremely small diameters associated with high frequency transistor devices and integrated circuits.

It has been observed that a contact arrangement which utilizes aluminum for the thin film expanded leads and interconnections, and gold for the external connecting wires is most desirable. The difficulty with this arrangement, however, is that when gold wires are bonded directly to aluminum, an intermetallic compound of gold and aluminum is formed. This compound, $AuAl_2$, exhibits a purple color and is commonly referred to in the industry as "purple plague." When gold and aluminum are in contact, $AuAl_2$ forms rapidly at 300° C., which is a temperature nearly always exceeded in making connections to or encapsulating semiconductor devices. While $AuAl_2$ is a reasonably good conductor, it has extremely poor mechanical properties. It is brittle, and device reliability decreasing as a result of its formation. In order to avoid the formation of $AuAl_2$, aluminum has been proposed for use as a lead wire. However, since aluminum forms aluminum oxide quite readily when exposed to air, this would be undesirable. In addition the "plague" will form within the device package at the header post or tab electrode, which is required to be gold plated by most semiconductor device users, particularly the military.

In addition to the aforementioned problems and considerations associated with selecting a suitable contact structure, there are other requirements. It is desirable for both integrated circuits and discrete devices to hermetically seal with a glass layer, each individual junction, and in particular the collector-base junction of transistors. There are difficulties associated with this objective, however, due in part to the minute dimensions of the semiconductor regions, which prevent the application of ohmic contacts above the glass layer that seals the junctions. Therefore, since these contacts cannot be applied above the glass that hermetically seals the junctions, they must be applied beneath it. Hence a metal must be chosen for such contacts which is suitable for making ohmic contact under glass with the various regions of the semiconductor device.

Expanded contacts are destroyed by the direct application of even a low melting temperature glass over the contacts. After such application the glass corrodes the contact metal, whereupon bits of the metal break away and float to the upper surface of the glass layer.

It has been observed that when a layer of silicon oxide is applied between the glass layer and the metal contacts, the contacts are not destroyed, Also, in integrated circuitry, due to the multitude of components that need to be interconnected to perform the desired circuit function, it is necessary to provide various levels of interconnections which need to be isolated from one another in order to avoid shorting. The isolation of these various levels of interconnections is accomplished by depositing a layer of silicon oxide between the various levels or interconnections. Consequently, the material used for the expanded contacts and interconnections must adhere well to the silicon oxide layer and must have a thermal coefficient of expansion closely matching the silicon oxide layer.

With the aforementioned requirements in mind, it is the object of this invention to provide improved contacts and interconnections for semiconductor devices, particularly silicon planar transistors and integrated circuits of the type having silicon oxide coatings thereon. More specifically, the object is to provide a multilayer, or sandwich, type contact arrangement which forms an ohmic and low resistance electrical connection to the silicon material, adheres well to the silicon and to the silicon oxide surfaces, has a high conductivity, does not tend to degrade the semiconductor device by its presence, has a thermal coefficient of expansion closely matching that of the insulating layer, usually silicon oxide, which separates the various levels of interconnections in an integrated circuit, which is also adjacent the glass layer that serves to passivate the junctions of semiconductor devices, and which lends itself to convenient techniques such as metal evaporation and photographic masking and etching procedures for its placement. A further object is to provide such a contact arrangement utilizing aluminum as the contact material to the semiconductor regions and gold as the external lead connector.

In accordance with these objects the present invention involves a four layer contact system comprising a first layer of evaporated aluminum, a second layer of evaporated nickel, a third layer of evaporated gold, followed by a fourth layer of electrolessly plated nickel. The thin film aluminum layer makes direct contact to the silicon material, providing a very low resistance ohmic contact (being the fourth best conductor), adheres well to the silicon and silicon oxide, and its high melting point (660° C.) and high eutectic temperature with silicon (577° C.) allow its use at ordinary processing and operating temperatures without degrading device characteristics. The layer of evaporated nickel provides excellent isolation between the aluminum layer and the gold layer in order to avoid the formation of the "purple plague." The evaporated gold layer provides the surface to which the leads, also of gold, make external connection. The gold is used because of its excellent conductivity, because of the ease with which it can be deposited by evaporation, because it lends itself nicely to photoresist etch procedures, and because it is easily bonded with a gold wire, producing no deleterious effects at the contact-to-wire interface. However, as discused above, the poor adherence of gold to the silicon oxide layer as well as the mismatch of thermal coefficient of expansion between the gold layer and the silicon oxide layer requires the formation of a fourth layer of electroless plated nickel intermediate the gold layer and the silicon oxide. The nickel provides a far closer match of thermal coefficient to the silicon oxide than the gold and, in addition, adheres to the silicon oxide much better than the gold layer. Consequently, the electroless plated nickel is placed above the gold layer, thereby providing a four level expanded contact and interconnection arrangement, the fourth layer of electrolessly plated nickel being removed only in the area of the bonding pads to allow the gold wires to be connected to the gold layer.

The novel features believed to be characteristic of this invention are set forth in the appended claims. The invention itself, however, as well as other objects, advantages and features thereof may best be understood by reference to the following detailed description of illustrative embodiments when read in conjunction with the accompanying drawings, in which:

Figure 4:
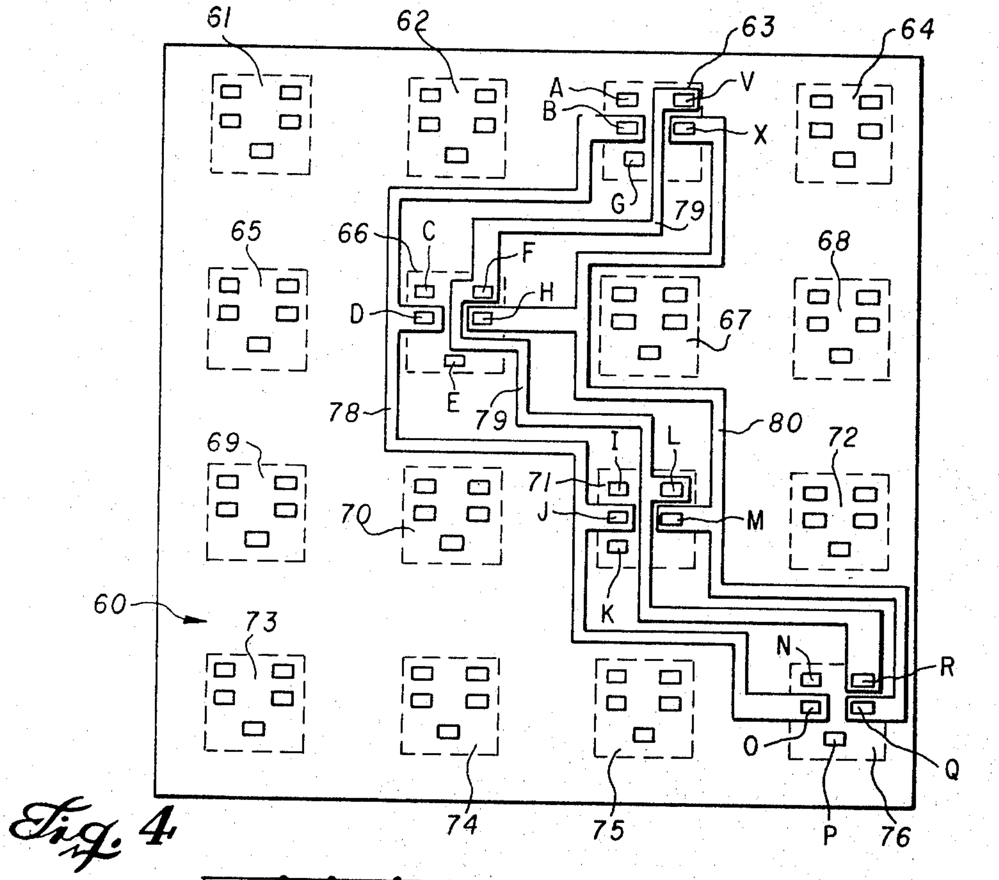
FIGURE 4 is a plan view, greatly enlarged, of a semiconductor wafer containing a plurality of functional elements with a pattern of second level interconnections defined thereon to provide a circuit function of an integrated circuit.
Figure 6:
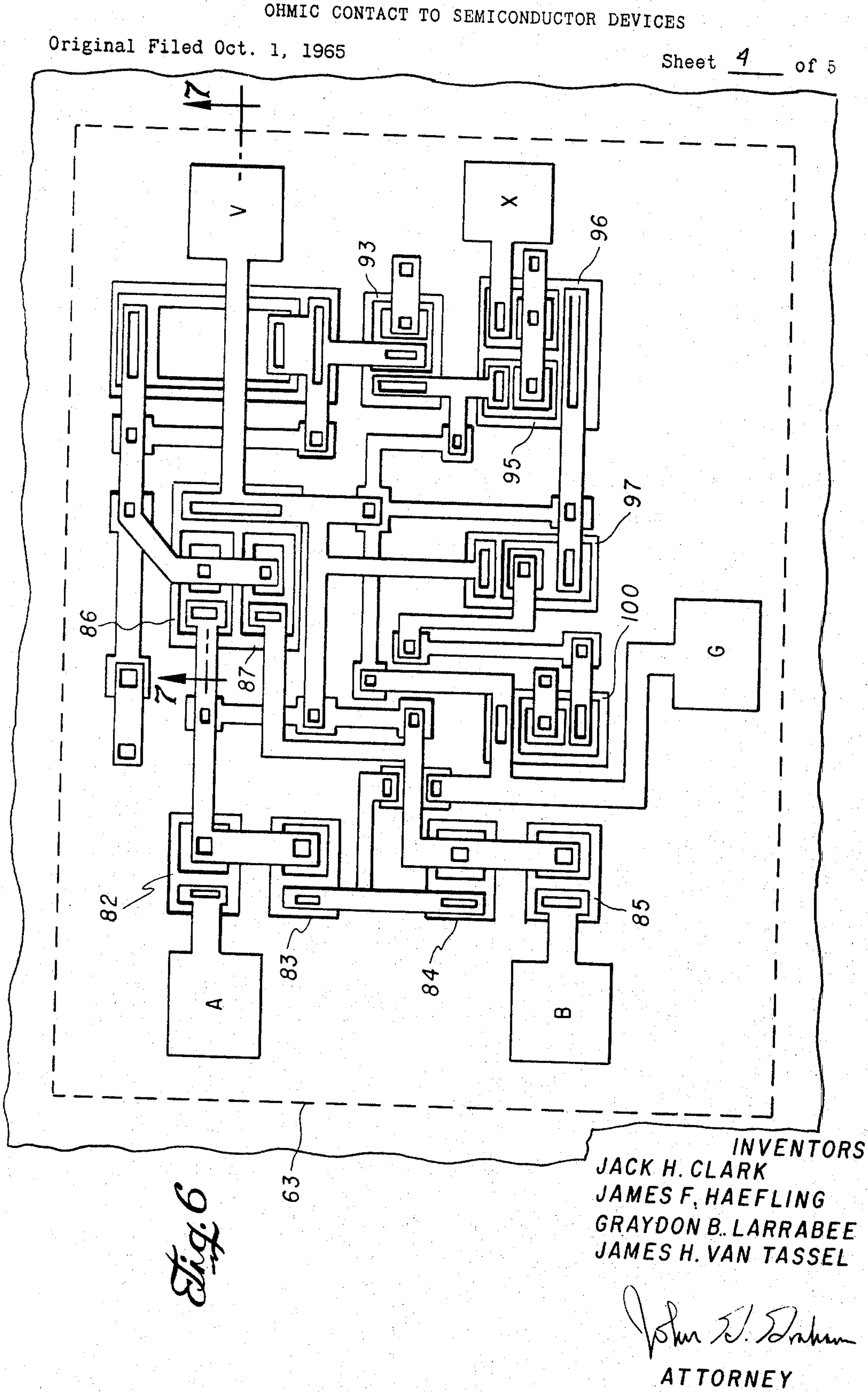
Figure 7:
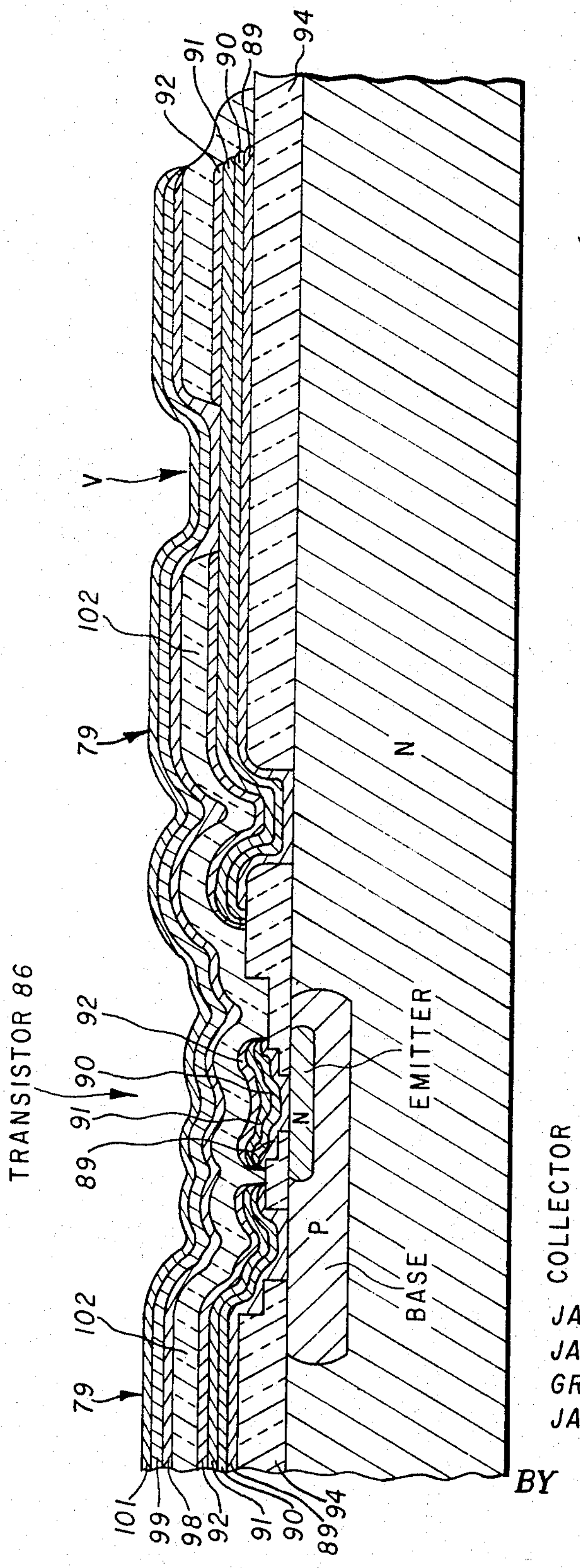

FIGURE 6 is a plan view, greatly enlarged, of the layout of circuit components in one of the functional elements in the integrated circuit structure shown in FIGURE 4, the plan view illustrating the first level of interconnections between the various circuit components; and FIGURE 7 is a sectional view of the wafer of FIGURE 6 taken along the section line 7—7 in FIGURE 6, showing the two levels of interconnections and illustrating the use of the contact system of the present invention.

Figure 1:
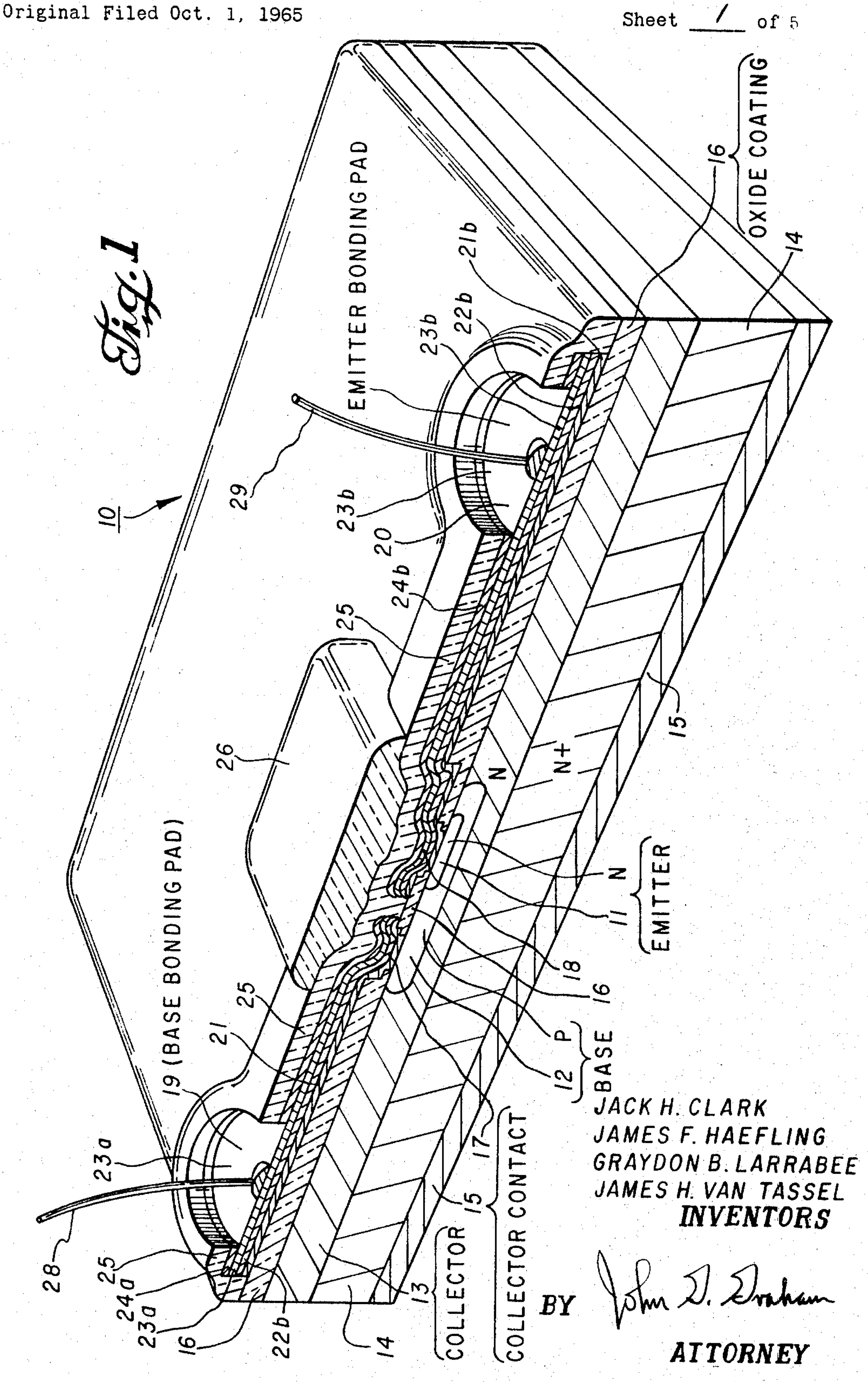
FIGURE 1 is a plan view of a semiconductor wafer having a planar junction transistor formed therein with a glass and oxide coating passivating the junction, and utilizing the contact structure of the present invention.

Referring now to FIGURE 1, there is depicted a semiconductor wafer 10 having a transistor formed therein comprising an N-type emitter region 11, P-type base region 12, and an N-type collector layer 13. A very low resistivity layer 14 provides a low resistance path to the collector contact 15. The transistor is formed by conventional planar techniques, using successive diffusions with silicon oxide masking. This process leaves a silicon oxide coating 16 on the top surface of the wafer with the coating over the collector layer 13 being thicker than over the base region 12, leaving the stepped configuration as seen in FIGURE 1. For high frequencies, the geometry of the various regions of the transistor is extremely small, the elongated emitter region 11 being perhaps a 0.1 to 0.2 mil wide and less than a mil long. The base region 12 is about 1 mil square. The pair of holes 17 and 18 is provided in the oxide layer 16 by etching, for example, for the base and emitter contacts, respectively. Due to the extremely small size of the actual base and emitter contact areas (one or two-tenths of a mil in width), the contacts must be expanded out over the silicon oxide layer 16 by way of narrow fingers or strips, about one or two-tenths of a mil or less, the strips terminating in base bonding pad 19 and emitter bonding pad 20. The pads 19 and 20 are large enough to permit bonding of 0.7 to 1 mil external gold wires thereto.

As previously mentioned, the expanded contacts comprise a four layer sandwich structure, a first evaporated layer **21*a* and 21*b* of aluminum making direct contact to the base and emitter regions, respectively; a second layer 22*a* and 22*b* of evaporated nickel isolating the aluminum layer 21*a* and 21*b* from a third evaporated layer of gold, 23*a* and 23*b*, and a fourth layer of electroless plated nickel 24*a* and 24*b* overlying the layer of gold 23*a* and 23*b*. A layer of silicon oxide 25 overlies the four layer sandwich expanded contact, and a glass layer 26 is centrally located so as to overlie the junctions of the transistor in order to passify said junctions. As will be described subsequently, portions of the oxide layer 25 and the electroless plated nickel layer 24*a* and 24*b* are removed at the contact pads 19 and 20 so as to expose the underlying gold layer 23*a* and 23*b* upon which the external gold wires 28 and 29** are then bonded, respectively.

Figure 2:
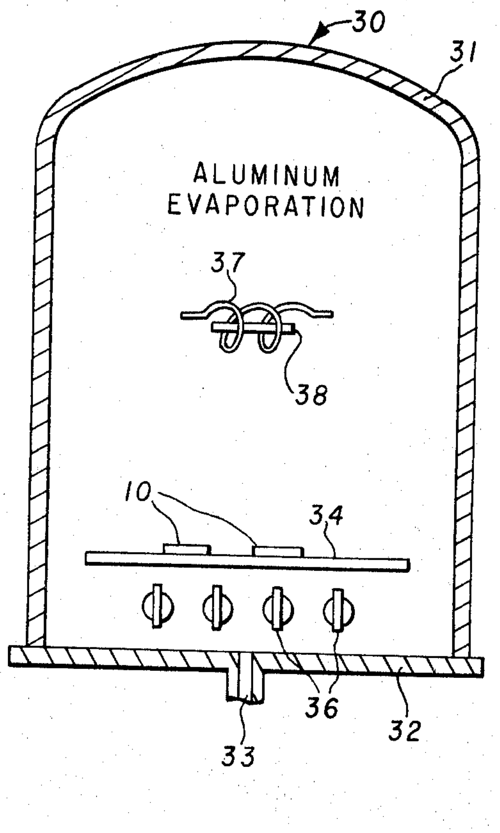
FIGURES 2 and 3 are schematic representations of evaporation chambers suitable for carrying out the method of applying the contact structure of this invention.
Figure 3:
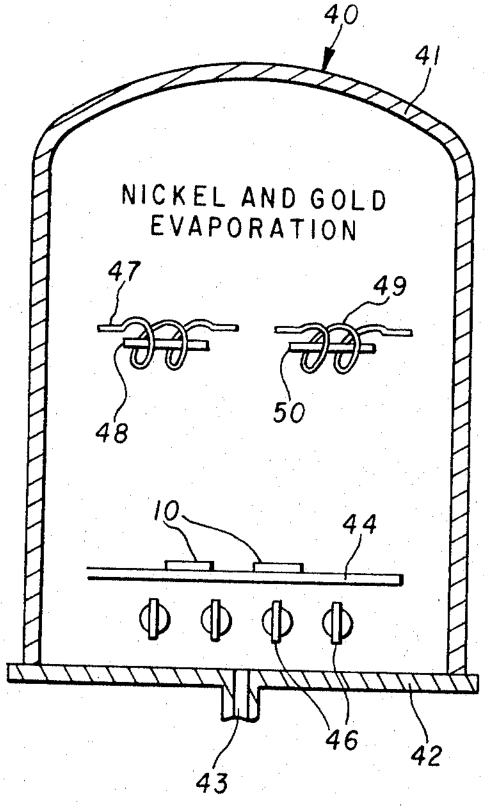

There is now described the method of providing the four layered contact structure of the present invention. The apparatus used for the evaporation of the aluminum layer **21*a*–21*b*, the nickel layer 22*a*–22*b*, and the gold layer 23*a*–23*b* includes two evaporation chambers 30 and 40 depicted in FIGURES 2 and 3, respectively. The necessity for two evaporation chambers is due to the fact that the aluminum evaporation is carried out in a chamber separate from that of the gold evaporation step in order to avoid the formation of "purple plague." Accordingly, the aluminum evaporation step is first carried out in the chamber 30 and the slices 10 are then transferred to the evaporation chamber 40 for the nickel and gold evaporation. The evaporation chamber 30 comprises a bell jar 31 mounted on a base plate 32. An opening 33 in the base plate is connected to a vacuum pump (not shown) for evacuating the chamber. A platform 34 of any suitable material, for example, an aluminum sheet, is located above the base plate 32 by means not shown, and serves as the work holder for a plurality of silicon slices 10, each of which has formed at its upper face, in undivided form, dozens or hundreds of the transistors of the kind indicated in FIGURE 1. Below the platform 34 a bank of quartz infrared tubes 36 is positioned, the tubes functioning to heat the platform and the slices to any desired temperature in the general range of 200–400° C., preferably at 275° C., and to hold the slice temperature at the selected point with a fair degree of precision. A suitable temperature control, including a thermocouple and a feedback arrangement (not shown), is provided for this purpose. About 4 inches above the platform 34 there is positioned a tungsten coil 37 for evaporating the charge of aluminum 38**.

The chamber 30 is evacuated to a pressure of approximately $6\times10^{-6}$ mm. of mercury, and the infrared tubes 36 are energized to bring the temperature of the platform 34 and the slices 10 to approximately 275° C. The tungsten filament 37 is then energized, and an aluminum film 21*a*–21*b* (not shown in FIGURE 2) is then deposited from the aluminum source 38 to a thickness of perhaps 2 to 3 microinches upon the entire top face of each slice 10, the holes for the emitter and base contacts having already been cut.

The slices 10, with the aluminum film 21 thereon, are then transferred as quickly as possible to the evaporation chamber 40 in order to deposit the thin nickel layer 22*a*–22*b* and then the gold layer 23*a*–23*b*. The transfer between the evaporation chamber 30 and the evaporation chamber 40 should be effected as quickly as possible because of the tendency for a film of aluminum oxide to form over the aluminum due to the oxygen and water residue in the chamber 30.

The evaporation chamber 40 (FIGURE 3) is similar to the evaporation chamber 30, comprising a bell jar 41 mounted on a base plate 42, an opening 43 in the base plate for connection to a vacuum pump for evaporating the chamber and a platform 44 (of stainless steel) serving as the workholder for the plurality of silicon slices 10. Power is applied to the bank of infrared tubes 46 in order to heat the platform 44 and the slices 10 to about 50 to 200° C., preferably 100° C., and a tungsten filament 47 is then energized to evaporate a charge 48 of nickel upon the aluminum coated slice 10, forming the thin nickel layer 22*a* ad 22*b* (not shown in FIGURE 3). The evaporated nickel layer 22*a*–22*b* is formed to a thicknes of perhaps 6 to 8 microinches. The power applied to the infrared tubes 46 is then increased slightly so that the platform 44 and the slices 10 heat up to approximately 100° C. to 350° C., preferably 150° C., and the tungsten filament 49 is then energized to evaporate a charge 50 of gold, forming the thin gold layer 23*a*–23*b* (not shown in FIGURE 3) to a thickness of from 18 to 22 microinches above the evaporated nickel layer 22*a*–22*b*. In order to insure good ohmic contact and mechanical adherence, it may be desired to subject the wafer 10 to a preevaporation cleaning procedure. Any conventional process may be used.

After removing the slice 10 from the evaporation chamber 40, the excess portions of the alminum-nickel-gold coatings 21–23 are removed by subjecting the silicon slices to a selective photoresist masking and etching treatment. A thin coating of a photoresist polymer, Eastman Kodak KMER, for example, is applied to the entire top surface of the wafer or slice 10. The photoresist is exposed to ultraviolet light through a mask which allows the light to reach the areas where the three layer film is to remain and the photoresist is then subjected to photodeveloping solution. The unexposed photoresist is removed by the photodeveloping solution, a layer of etch-resistant photoresist overlying the three layer evaporated metallic structure remaining in a pattern corresponding to the expanded emitter contact and bonding pad 20 and the expanded base contact and bonding pad 19, as seen in FIGURE 1.

The slice 10 is now subjected to three etching solutions to remove the unwanted portions of the aluminum, nickel, and gold layers. The gold layer 23*a*–23*b* is etched by a cyanide solution, for example, at about 70° C. for about 50 to 75 seconds. A suitable cyanide etch solution is an aqueous solution of 60 grams per liter of Metex Aurostrip supplied by McDermid Incorporated of Waterbury, Conn. The slices are rinsed well in water after the cyanide etch to prevent the formation of toxic gas in subsequent processing. After the gold etching step, the excess nickel is removed by another suitable etchant, for example a 50% nitric acid solution at about 60° C., the etchant being applied for less than 5 seconds. The excess aluminum is then removed by still another suitable etch solution such as 70 milliliters phosphoric acid, 15 milliliters acetic acid, 3 milliliters nitric acid and 5 milliliters of deionized water. The etching time is approximately 5 seconds at a temperature of about 50 to 70° C. The etch-resistant photoresist mask which has remained intact through the three etching steps is now removed by rinsing in a solvent such as methylene chloride.

There is now described the method of depositing the fourth layer of the contact structure of the present invention, the electroless plated nickel layer 24. The entire silicon slice 10, with the three layer evaporated structure just described, is completely submerged in a suitable nickel plating bath, for example, the plating solution supplied by Enthone Inc., of New Haven, Conn., known as Nickel–410A and 410B. This solution has been adjusted to a pH value of approximately 4.5 with ammonium hydroxide. The temperature of the plating solution is approximately 95° C., and a metal film 24 of approximately 5 microinches thickness is obtained by immersing the wafer 10 in the solution for from about 30 to 60 seconds. The advantage of electroless plating the fourth layer 24 of nickel as opposed to evaporating this layer upon the gold layer 23 is that the nickel will only plate upon the gold layer 23, and therefore obviates the necessity for etching away the unwanted portion of the nickel, thereby avoiding an extra step as well as avoiding any undercutting of the second layer 22*a*–22*b* of nickel.

The next step in the process for fabricating the transistor as shown in FIGURE 1 is to provide a layer 25 of silicon dioxide over the top surface of the wafer 10 completely covering the four layer contact structure. This silicon oxide layer may be deposited by electron beam evaporation techniques, for example, or any other suitable technique. A glass layer 26 is then formed above that portion of the oxide layer 25 which overlies the junctions of the transistor as shown in FIGURE 1, to passivate said junctions.

By conventional photographic masking and etching techniques thereafter, portions of the silicon oxide layer 25 and the electroless nickel layer 24 are selectively removed at the bonding pad locations 19 and 20 to expose the corresponding areas of the gold layer 23*a* and 23*b*. It is desirable for the etching operations to first apply buffered hydrogen fluoride ($NH_4F/HF$) in order to selectively remove the silicon oxide layer 25. The buffered hydrogen fluoride does not affect the nickel layer 24, and hence this layer prevents any etching of the underlying gold layer 23. A phosphoric acid solution comprising 70 parts phosphoric acid, 15 parts acetic acid, 3 parts nitric acid, and 5 parts deionized water is next applied to selectively remove the nickel layer 24, and since this solution will not substantially affect gold layers 23*a* and 23*b* of gold are exposed.

Gold wires 28 and 29 are then bonded by conventional techniques to these exposed areas 23*a* and 23*b* of the gold film in order to provide external ohmic connections to the base and emitter, respectively. The resulting structure is shown in FIGURE 1, wherein the four layer laminated structure comprising the evaporated layers of aluminum, nickel, and gold, and the fourth layer of electroless plated nickel, form the thin expanded contacts terminating in the bonding pads with the external gold wires making direct contact to the gold layer at the bonding pads.

There is now described with reference to FIGURES 4 through 7 an integrated circuit device utilizing the multilayered contact structure of this invention. A bar or wafer 60 of semiconductor material, in this case silicon semiconductor material, is shown in FIGURE 4, having a large number of functional elements 61–76 thereon. Although only 16 such functional elements are shown, ordinarily a much larger number are utilized. Each of the functional elements 61–76 contains a number of transistors, resistors, capacitors or the like interconnected to form the desired electrical function. For example, the functional element 63 may comprise the circuit such as that shown in FIGURE 5. The circuit includes the P-N-P transistors 82, 83, 84 and 85 and the N-P-N transistors 86, 87, 93, 95, 96, 97 and 100, and has three input terminals A, B, and X, and an output terminal G. These, along with voltage supply terminal V, correspond to the five terminals seen on the functional element 63 in FIGURE 4. The transistors and the other circuit components may be formed within the semiconductor wafer 60 by any of the techniques known in the integrated circuit art such as, for example, epitaxial growth or diffusion operations. Ordinarily, the transistors, resistors, and capacitors are formed by diffusion, using oxide masking, the oxide remaining on the surface to provide insulation between the semiconductor surface and the subsequently deposited metal contacts.

Figure 5:
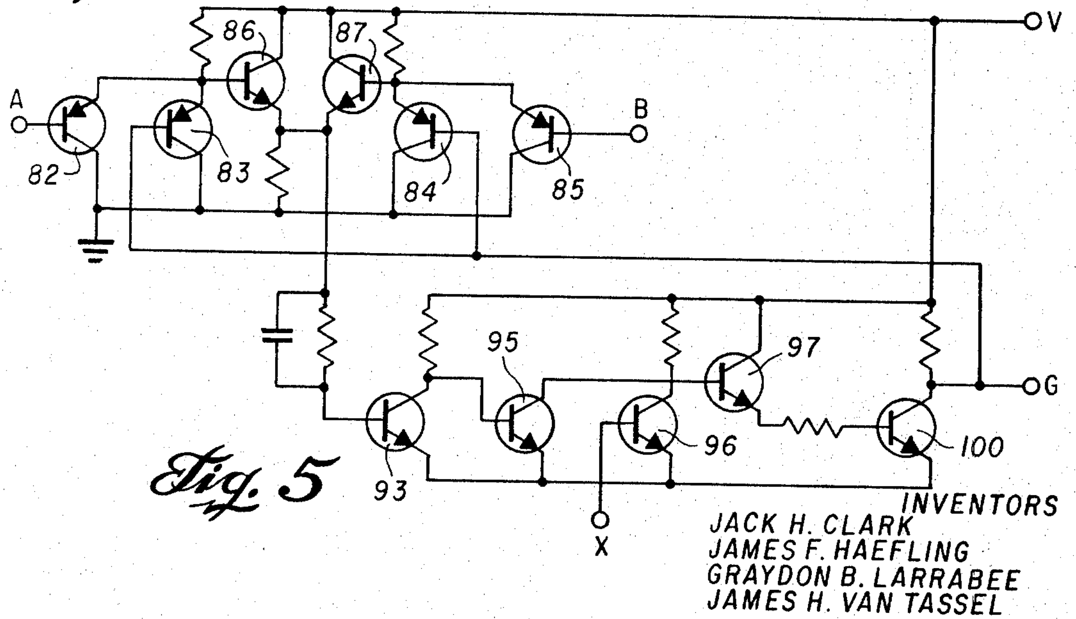
FIGURE 5 is a schematic diagram of the electronic circuit in one of the functional elements of the wafer shown in FIGURE 4.

FIGURE 6 shows a greatly enlarged plan view, or layout, of the circuit shown in FIGURE 5 formed by integrated circuit techniques in the semiconductor wafer 60. This circuit provides the operating characteristics of the functional element 63, for example. It is to be observed that there is a large number of first level electrical interconnections joining the various transistors with each other as well as with the other circuit components represented in FIGURE 5 and eventually to the terminals A, B, V, X and G. As will be subsequently described, these first level interconnections are formed of the four layer contact structure of the present invention.

Referring again to FIGURE 4, it should be observed that the semiconductor wafer 60 contains a large number of functional elements on one face, each element containing five terminals, or lands, representing its inputs, output and power supply input, the terminals being part of an internal circuit much like the one schematically shown in FIGURE 5, which circuit provides the operating characteristics of the functional element.

For the purpose of this embodiment, it is desired to produce a system containing four of the sixteen functional elements 61–76 appropriately interconnected. As depicted in FIGURE 4, therefore, the terminals B, D, J, and O of functional elements 63, 66, 71 and 76 are electrically connected by the interconnector 78; similarly the terminals V, F, L and R are electrically connected by the interconnector 79, and the terminals X, H, M, and Q are electrically connected by the interconnector 80.

Recognizing that each functional element includes the circuit components and first level interconnection strips as in FIGURE 6, it is seen that the second level interconnection pattern of FIGURE 4 must necessarily overlie some of the first level metal interconnection pattern within the functional elements. For this reason, and also due to the fact that the interconnections between functional elements are preferably made in an operation separate from that which forms the interconnections within an element, the pattern of FIGURE 4 is formed at a second level separated from the first level interconnection pattern by an insulating material such as silicon oxide.

This arrangement is illustrated in FIGURE 7, a sectional view or portion of the semiconductor wafer 60 at the point where second level interconnection 79, depicted in FIGURE 4, engages the terminal or land V of the functional element 63 directly above one of the N-P-N transistors 86. Holes are cut in the oxide layer 94 above the collector, base, and emitter, respectively, and the four layer expanded interconnector arrangement is provided in the manner described with reference to FIGURES 1–4. Accordingly, the first level interconnectors making contact to the N-type collector layer, P-type base region and the N-type emitter region, respectively, of the N-P-N transistor comprise a first layer 89 of evaporated aluminum, a second layer 90 of evaporated nickel, a third layer 91 of evaporated gold, and a fourth layer 92 of electrolessly plated nickel. These first level interconnectors will ohmically connect the collector region of the transistor 86 to the bonding pad V, and the emitter and base regions to the various regions of the other transistors and resistors, for example. The second level interconnector 79 comprises a three layer laminated structure, the first layer 98 being of evaporated nickel, the second layer 99 being of evaporated gold and the third layer 101 being of electrolessly plated nickel. As insulating layer 102, for example silicon dioxide, formed by any suitable technique, such as electron beam evaporation, separates the first level collector interconnector from the second level interconnector 79. The second level interconnection 79 makes contact with the first level collector interconnector at the bonding pad or terminal V, a portion of the silicon dioxide layer 102 and the electroless plated nickel layer 92 having previously been removed by conventional masking and etching techniques in order to allow the layer 98 of evaporated nickel of the interconnector to make physical contact to the gold layer 91, the evaporated nickel layer 99 also adhering well to the silicon oxide layer 102.

While the invention has been described with reference to specific methods and embodiments, it is to be understood that this description is not to be construed in a limiting sense. For example, various process steps may be used in fabricating the transistors, integrated circuits, or the like, not specifically described above. As another example, it is ordinarily desirable in order to provide good low resistance ohmic contacts to the semiconductor material to dope the regions of the silicon where the aluminum layer is to make contact to a high impurity concentration, regardless of whether N-type or P-type silicon is used.

In addition, although a specific device, a high frequency transistor, and a specific integrated circuit structure have been described, the four layer laminated contact structure of the present invention is useful for many other types of semiconductor devices and integrated circuit structure such as diodes, resistors, oxide dielectric capacitors, metal oxide semiconductor devices, etc. The various modifications of the disclosed embodiments, as well as other embodiments of the invention may become apparent to persons skilled in the art without departing from the spirit and scope of the invention as defined by the appended claims.

What is claimed is:

1. A contact system for a semiconductor device comprising a semiconductor wafer having P and N type conductivity regions extending from one surface into said wafer with at least one PN junction terminating at said one surface, an insulating layer on said one surface, at least one aperture in said insulating layer exposing at least one of said regions, a sandwich structure of electrically conductive layers adherent to said insulating layer and extending into said at least one aperture in ohmic contact with said at least one of said regions, an intermediate layer in said sandwich structure comprised of gold, another insulating layer overlying and adherent to said sandwich structure, at least one aperture in said another insulating layer exposing a portion of said sanddich structure and an electrically conductive second level interconnection overlying said another insulating layer ohmically connected to said portion of said sandwich structure through said at least one aperture in said another insulating layer.

2. A contact system according to claim 1, wherein said electrically conductive second level interconnection is ohmically connected directly to a portion of said intermediate layer.

3. A contact system according to claim 1, wherein said sandwich structure comprises a layer of nickel continuous with each side of said intermediate layer.

4. A contact system according to claim 1, wherein said electrically conductive second level interconnection comprises a metal layer adherent to said another insulating layer and a layer comprising gold on said metal layer.

5. A contact system according to claim 4, wherein said metal layer is nickel.

6. A contact and interconnection system for a semiconductor network of the type having a plurality of circuit components formed within and extending to one surface of a semiconductor wafer, an insulating layer on said surface, said insulating layer having a plurality of apertures exposing a plurality of regions of said circuit components, at least one interconnection between said plurality of regions comprising a sandwich structure of electrically conductive layers adherent to said insulating layer and extending into said apertures in ohmic contact with said regions, an intermediate layer in said sandwich structure comprised of gold, another insulating layer overlying and adherent to said sandwich structure, at least one aperture in said another insulating layer exposing a portion of said sandwich structure and at least one electrically conductive second level interconnection overlying said another insulating layer ohmically connected to said portion of said sandwich structure through said at least one aperture in said another insulating layer.

7. A contact and interconnection system according to claim 6, wherein said electrically conductive second level interconnection makes direct ohmic contact with at least one portion of said intermediate layer comprised of gold of said sandwich structure.

8. A contact and interconnection system according to claim 6, wherein said sandwich structure comprises a layer of nickel contiguous with each side of said intermediate layer comprised of gold.

9. A contact and interconnection system according to claim 6, wherein said electrically conductive second level interconnection comprises a metal layer adherent to said another insulating layer and a layer comprising gold on said metal layer.

10. A contact system according to claim 9, wherein said metal layer is nickel.

11. A contact and lead arrangement for a semiconductor device of the type including a silicon wafer having a region adjacent one face thereof with a P-N junction between such region and other silicon of the wafer, said junction extending to said one face beneath a silicon oxide coating, the coating defining a small opening over said region, the contact and lead arrangement comprising a first layer of evaporated aluminum engaging the surface of said region in said opening in the silicon oxide coating, the said layer of aluminum extending from said opening out over said silicon oxide coating in direct contact therewith and over the edge of said junction to a position spaced from said region on said one face, a second layer of evaporated nickel overlying said first layer of evaporated aluminum, a third layer of evaporated gold overlying said second layer of evaporated nickel, and a fourth layer of electrolessly plated nickel overlying said third layer of evaporated gold.

12. An ohmic contact structure for a semiconductor device of the type having at least two regions of opposite type conductivity with a P-N junction therebetween, said structure comprising a first layer of aluminum in contact with one of the said regions, a second layer of nickel overlying said first layer, a third layer of gold overlying said second layer, and a fourth layer of nickel overlying said third layer.

13. A semiconductor device comprising a silicon wafer, a silicon oxide coating on one face of said wafer having an opening therein, a shallow region of one conductivity type adjacent said one face beneath said opening, a P-N junction between said region and contiguous portions of said wafer, said junction extending to said one face beneath the silicon oxide coating, a first layer of aluminum engaging the surface of said shallow region through said opening in the silicon oxide coating, the said first layer extending from said opening out over said silicon oxide coating in direct contact therewith and over the edge of said junction to form a bonding pad spaced from said region on said one face, a second layer of nickel overlying said first layer, a third layer of gold overlying said second layer, a wire larger in diameter than the smallest dimension of said opening bonded to the gold layer at one location on said bonding pad, a fourth layer of nickel overlying said third layer of gold except at the said one location, and an oxide layer overlying said fourth layer.

14. A contact and interconnection arrangement for a semiconductor network of the type having a plurality of circuit components formed within a body of semiconductor material and at least a first and second lever of interconnections ohmically connecting select regions of certain of said circuit components, said first level of interconnection comprising a first layer of evaporated aluminum, a second layer of evaporated nickel overlying said first layer, a third layer of evaporated gold overlying said second layer and a fourth layer of electrolessly plated nickel overlying said third layer, said second lever of interconnection comprising a first layer of evaporated nickel, a second layer of evaporated gold overlying said first layer, and a third layer of electrolessly plated nickel overlying said second layer, and an insulating layer intermediate said first and second level.

15. A contact and interconnection arrangement for a semiconductor network of the type having a plurality of circuit components formed within a body of semiconductor material and at least a first and second level of interconnections ohmically connecting select regions of certain of said circuit components, said first level of interconnection comprising a first layer of evaporated aluminum, a second layer of evaporated nickel overlying said first layer, a third layer of evaporated gold overlying said second layer, and a fourth layer of electrolessly plated nickel overlying said third layer, said second level of interconnection comprising a first layer of evaporated nickel, a second layer of evaporated gold overlying said first layer, and a third layer of electroless plated nickel overlying said second layer, a portion of the first layer of the second lever interconnection engaging a portion of the third layer of the first level interconnection, and a layer of silicon oxide intermediate said first and second level interconnection.

References Cited

UNITED STATES PATENTS

| | | | |
|---|---|---|---|
| 2,973,466 | 2/1961 | Atalla | 317—234.5 |
| 3,199,002 | 8/1965 | Martin | 317—234.5 |
| 3,241,931 | 3/1966 | Triggs et al. | 317—234.5 |
| 3,290,565 | 12/1966 | Hastings | 317—234.3 |
| 3,290,570 | 12/1966 | Cunningham et al. | 317—234.3.1 |
| 3,320,484 | 5/1967 | Riley et al. | 317—235.22 |
| 3,331,994 | 7/1967 | Kile | 317—234 |

JOHN W. HUCKERT, *Primary Examiner.*

R. F. POLISSACK, *Assistant Examiner.*

U.S. Cl. X.R.

317—235